United States Patent
Lee

(10) Patent No.: US 8,723,581 B1
(45) Date of Patent: May 13, 2014

(54) INPUT BUFFERS

(71) Applicant: Via Technologies, Inc., New Taipei (TW)

(72) Inventor: Yeong-Sheng Lee, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/753,746

(22) Filed: Jan. 30, 2013

(51) Int. Cl.
*H03L 5/00* (2006.01)

(52) U.S. Cl.
USPC ............................. 327/333; 327/112; 326/81

(58) Field of Classification Search
USPC ................ 327/108, 112, 333; 326/68, 80, 81; 365/189.11
See application file for complete search history.

(56) References Cited

U.S. PATENT DOCUMENTS

| | | | | |
|---|---|---|---|---|
| 5,200,921 A | * | 4/1993 | Okajima | ................... 365/189.11 |
| 6,166,580 A | * | 12/2000 | Sessions | ........................ 327/333 |
| 6,346,829 B1 | * | 2/2002 | Coddington | .................... 326/81 |

* cited by examiner

*Primary Examiner* — Long Nguyen
(74) *Attorney, Agent, or Firm* — McClure, Qualey & Rodack, LLP

(57) ABSTRACT

An input buffer is provided. The input buffer receives an input signal through an input terminal and outputs an output signal at an output terminal. The input circuit includes an input circuit and a level shifting circuit. The input circuit receives the input signal and generates a buffer signal according to the input signal. The level shifting circuit receives a first supply voltage and the buffer signal and generates the output signal at the output terminal according to the buffer signal and the first supply voltage. The first high level of the input signal is higher than a voltage level of the first supply voltage. When the input signal is at a first high level, the input circuit generates the buffer signal whose voltage level is between the first high level of the input signal and the voltage level of the first supply voltage.

16 Claims, 3 Drawing Sheets

INPUT BUFFERS

BACKGROUND OF THE INVENTION

1. Field of the Invention

The invention relates to an input buffer, and more particularly, to an input buffer with less power consumption.

2. Description of the Related Art

Nowadays, in advanced CMOS (Complementary Metal-Oxide-Semiconductor) processes (such as 28 nm processes), the gate oxide break-down voltage of MOS transistors are lower as compared with previous processes (such as 40 nm processes). The voltage differences between the gate and source/drain of the MOS transistors (Vgs or Vgd) may be required to remain below about 1.8V for devices fabricated by advanced processes. High voltage devices cannot be manufactured by the advanced CMOS processes. For example, 3.3V devices are not manufactured by the 28 nm processes. In addition, lower supply voltages such as 1V may be desirable in advanced ICs (integrated circuits) to save power. However, some peripheral components or other ICs may still operate at high voltages, such as 3.3V or 2.5V. The signals generated the peripheral components or other ICs may have high voltage levels. When the MOS transistors designed to work with lower supply voltages receive these signals, the MOS transistors may not operate appropriately, and they may be damaged by the high voltage levels. Thus, a circuit is provided to serve as an input buffer for converting high voltage levels to lower levels before the signals are received by internal circuits of the ICs. However, previous input buffer circuits may have current paths which induce leakage currents, which increases power consumption and are especially critical in portable devices.

BRIEF SUMMARY OF THE INVENTION

It is desirable to provide an input buffer which can prevent the occurrence of leakage currents when an external signal with a high level is inputted.

An exemplary embodiment of an input buffer is provided. The input buffer receives an input signal through an input terminal and outputs an output signal at an output terminal. The input circuit comprises an input circuit and a level shifting circuit. The input circuit is coupled to the input terminal. The input circuit receives the input signal and generates a buffer signal according to the input signal. The level shifting circuit is coupled to the input circuit and the output terminal. The level shifting circuit receives a first supply voltage and the buffer signal and generates the output signal at the output terminal according to the buffer signal and the first supply voltage. The first high level of the input signal is higher than a voltage level of the first supply voltage. When the input signal is at a first high level, the input circuit generates the buffer signal whose voltage level is between the first high level of the input signal and the voltage level of the first supply voltage.

Another exemplary embodiment of an input buffer is provided. The input buffer receives an input signal through an input terminal and outputs an output signal at an output terminal. The input buffer comprises a first transistor and a level shifting circuit. The first transistor has a control electrode coupled to the input terminal, an input electrode receiving a first supply voltage, and an output electrode outputting a buffer signal. The level shifting circuit is coupled to the output electrode of the first transistor and the output terminal. The level shifting circuit receives a second supply voltage and the buffer signal and generates the output signal at the output terminal according to the buffer signal and the second supply voltage. A first high level of the input signal is higher than a voltage level of the first supply voltage and a voltage level of the second supply voltage. The voltage level of the first supply voltage is between the first high level of the input signal and the voltage level of the second supply voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
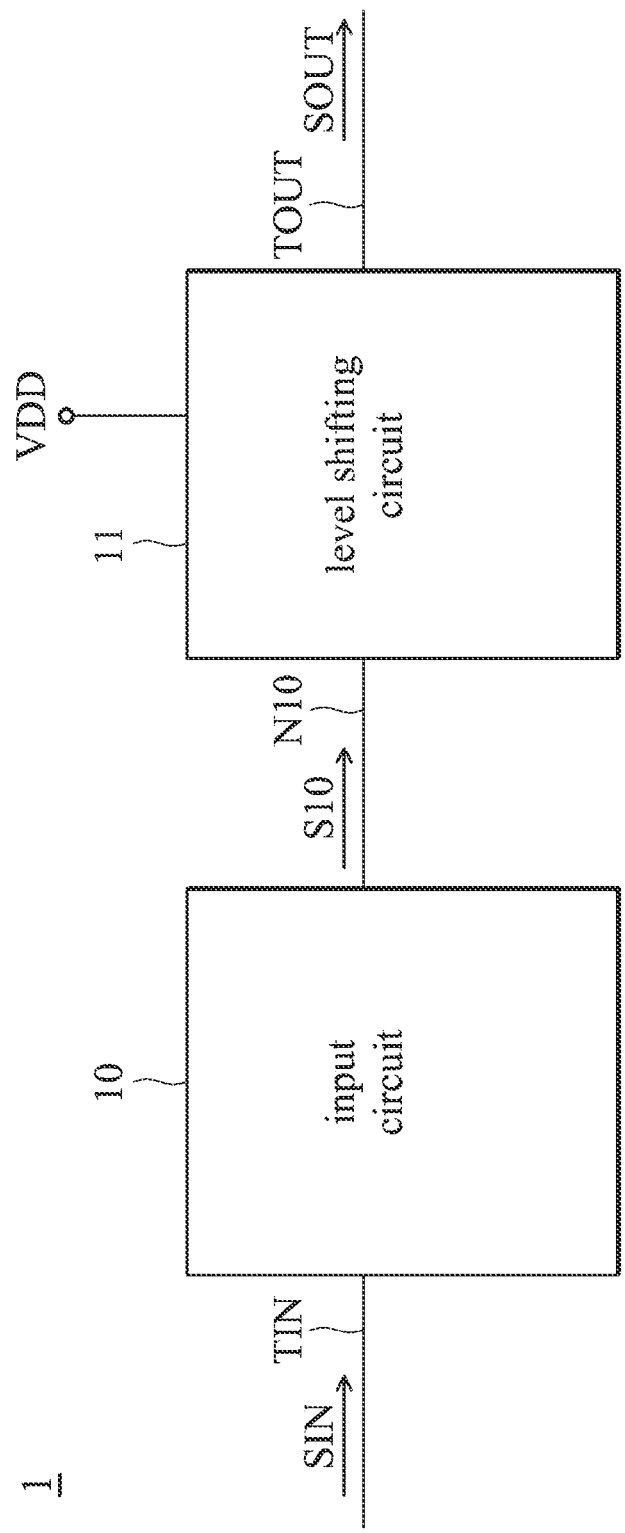
FIG. 1 shows an exemplary embodiment of an input buffer.

The following description is made for the purpose of illustrating the general principles of the invention and should not be taken in a limiting sense. The scope of the invention is best determined by reference to the appended claims.

Input buffers are provided. In an exemplary embodiment of an input buffer shown in FIG. 1, an input buffer 1 has an input terminal TIN and an output terminal TOUT. The input buffer 1 may receive an input signal SIN through the input terminal TIN and generate an output signal SOUT at the output terminal TOUT according to the input signal SIN, and the output signal SOUT may be received by internal circuits of an IC having lower operation voltages. In one embodiment, the input buffer 1 may be integrated in the IC. The input signal SIN may be at a high level and a low level, such as a high level of 3.3V and a low level of 0V. In the embodiment, the input signal SIN may be generated by an external circuit outside of the IC which may be manufactured by a process different from the manufacture process of the input buffer 1. The input buffer 1 comprises an input circuit 10 and a level shifting circuit 11. The input circuit 10 is coupled to the input terminal TIN for receiving the input signal SIN. The input circuit 10 blocks leakage current and generates a buffer signal S10 at the node N10. The level shifting circuit 11 further receives a supply voltage VDD; in other words, the level shifting circuit 11 is powered by the supply voltage VDD. In the embodiment, the high level of the input signal SIN is higher than the voltage level of the supply voltage VDD. For example, the voltage level of the supply voltage VDD is 1V which is lower than the high level 3.3V of the input signal SIN. The level shifting circuit 11 is coupled to the node N10 to receive the buffer signal S10. The level shifting circuit 11 performs a level-shifting operation on the buffer signal S10 to shift or change the level of the buffer signal S10 and generate the output signal SOUT at the output terminal TOUT to the internal circuits of the IC according to the level-shifting operation and the supply voltage VDD. In one embodiment, the supply voltage of the internal circuits of the IC may be the same as the supply voltage VDD, so that the received output signal SOUT is suitable for the operation of the internal circuits.

In the embodiment, when the input signal SIN switches from the low level of, for example, 0V to the high level of, for example, 3.3V, the level of the buffer signal S10 at the node N10 is pulled high through the coupling effect of a capacitor coupled between the input terminal TIN and the node N10. The level shifting circuit 11 then outputs the output signal SOUT with a low level according to the buffer signal S10 with the pulled-high level; i.e., the output signal SOUT and the buffer signal S10 are inverted. Moreover, when the input signal SIN is at the high level of 3.3V, the input circuit 10 may generate the buffer signal S10 whose voltage level is between the high level 3.3V of the input signal SIN and the voltage level (for example, 1V) of the supply voltage VDD, and the level shifting circuit 11 outputs the output signal SOUT with the low level regardless of the actual voltage level of the buffer signal S10. In an embodiment, when the input signal SIN is at the high level of 3.3V, the input circuit 10 generates the buffer signal S10 whose voltage level is equal to a level of 1.8V which is between the high level 3.3V of the input signal SIN and the voltage level 1V of the supply voltage VDD.

When the input signal SIN switches from the high level of 3.3V to the low level of 0V, the level of the buffer signal S10 at the node N10 is pulled to a low level through the coupling effect of the capacitor coupled between the input terminal TIN and the node N10. The level shifting circuit 11 then outputs the output signal SOUT with a high level according to the supply voltage VDD and the buffer signal S10 with the pulled-low level. Afterwards, the buffer signal S10 is kept at the low level and the level shifting circuit 11 outputs the output signal SOUT with the high level until the input signal SIN switches from the low level of 0V to the high level of 3.3V again. The actual voltage level of the low level of the buffer signal S10 may be determined according to the capacitance value of the capacitor and the high levels of the input signal SIN and the buffer signal S10.

In an embodiment, the above capacitor coupled between the input terminal TIN and the node N10 may be a parasitic capacitor formed in the input circuit 10. In another embodiment, the above capacitor coupled between the input terminal TIN and the node N10 may be a physical capacitor element.

According to the above embodiment of FIG. 1, the input buffer 1 has high voltage tolerance. When the input signal SIN may have the high level of 3.3V, the input buffer 1 can convert the input signal SIN to the output signal SOUT which may have the high level 1V for following components or ICs which may be manufactured by advanced CMOS processes (such as 28 nm processes). Moreover, due the configuration of the capacitor coupling the input terminal TIN and the node N10 in the input circuit 10, there is no direct leakage current path between the supply voltage VDD and the input terminal TIN.

Figure 2:
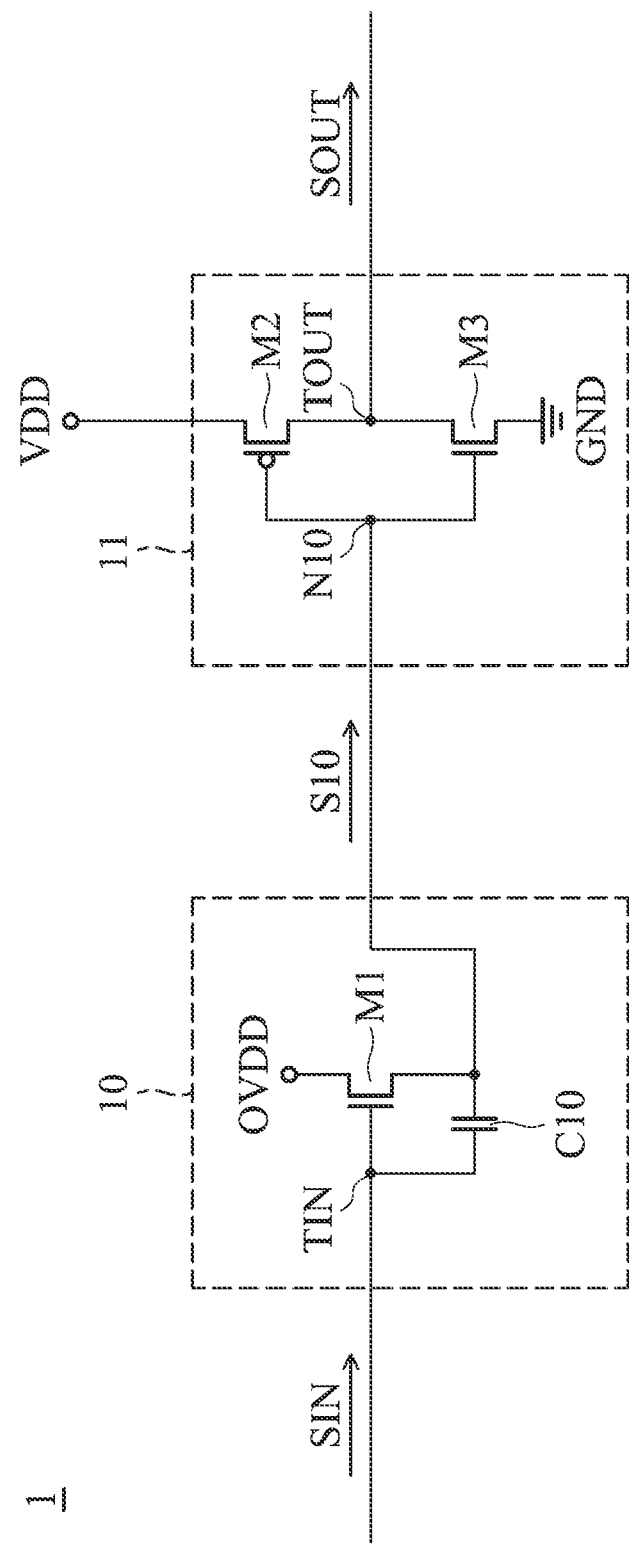
FIG. 2 shows another exemplary embodiment of an input buffer.
Figure 3:
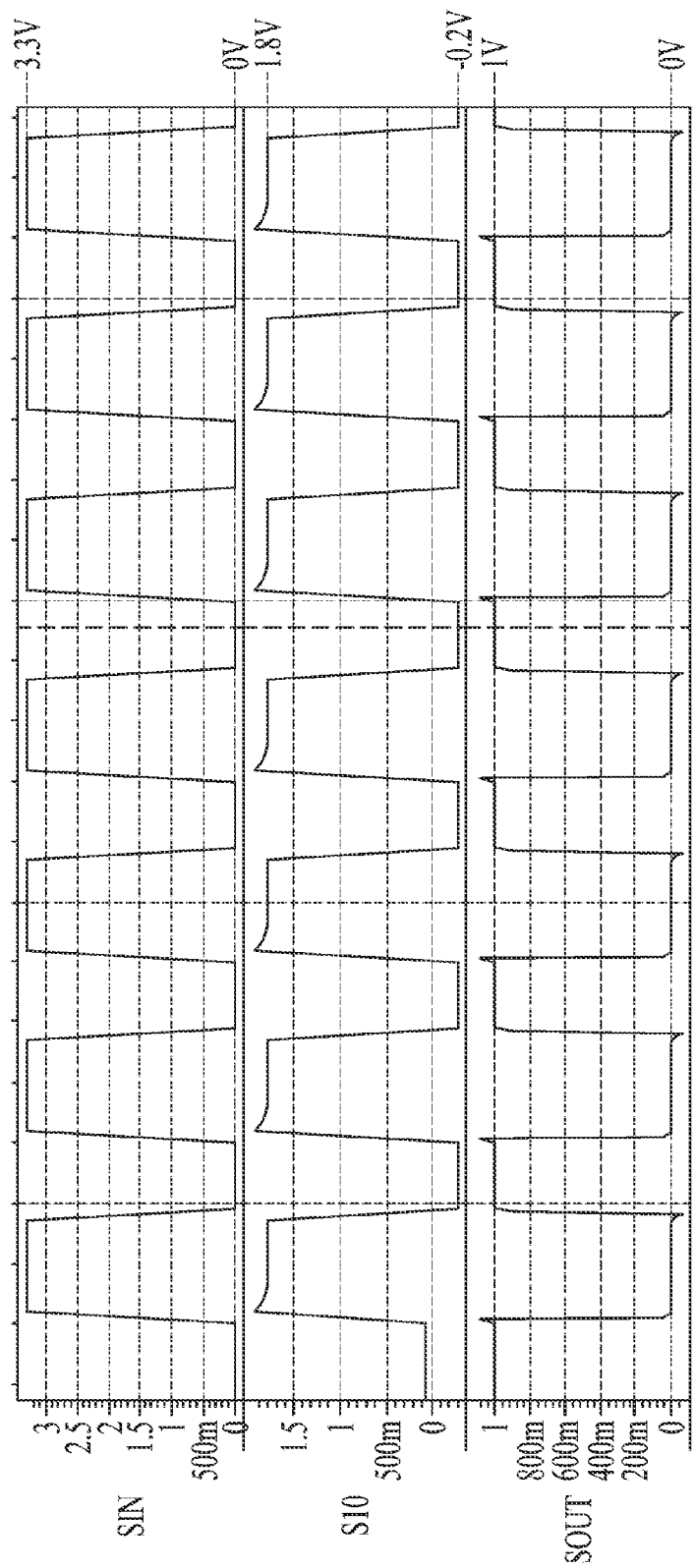
FIG. 3 shows waveforms of key signals.

FIG. 2 shows detailed structures of the input circuit 10 and the level shifting circuit 11. FIG. 3 shows waveforms of the input signal SIN, the buffer signal S10, and the output signal SOUT. Referring to FIG. 2, the input buffer 10 comprises a MOS (Metal-Oxide-Semiconductor) transistor M1. The level shifting circuit 11 comprises an inverter composed of MOS transistors M2 and M3. Each of the MOS transistors M1~M3 has a control electrode, an input electrode, and an output electrode. In the embodiment, the MOS transistors M1 and M3 are implemented by NMOS transistors, and a gate, drain, and source of an NMOS transistor serve as the control electrode, the input electrode, and the output electrode of each of the MOS transistors M1 and M3, respectively. Moreover, in the embodiment, the MOS transistor M2 is implemented by a PMOS transistor, and a gate, source, and drain of a PMOS transistor serve as the control electrode, the input electrode, and the output electrode of the MOS transistor M2, respectively The gate of the NMOS transistor M1 is coupled to the input terminal TIN, the drain thereof is coupled to the supply voltage OVDD which is used to power the input circuit 10, and the source thereof is coupled to the node N10. The gate of the PMOS transistor M2 is coupled to the node N10, the source thereof is coupled to the supply voltage VDD, and the drain thereof is coupled to the output terminal TOUT. The gate of the NMOS transistor M3 is coupled to the node N10, the drain thereof is coupled to the output terminal TOUT, and the source thereof is coupled to a reference voltage GND. In the embodiment, the reference voltage GND provides an equivalent voltage level with the level 0V. Referring to FIG. 2, the input circuit 10 further comprises a capacitor C10. The capacitor C10 serves as the above capacitor coupled between the input terminal TIN and the node N10. In an embodiment, the capacitor C10 may be a gate-source parasitic capacitor (Cgs) of the NMOS transistor M1. In another embodiment, the capacitor C10 may be a physical capacitor element.

Referring to FIGS. 2 and 3, when the input signal SIN switches from the low level of 0V to the high level of 3.3V, the NMOS transistor M1 is turned on and the buffer signal S10 is kept at a level determined by the supply voltage OVDD through the turned-on NMOS transistor M1; moreover, the level of the buffer signal S10 at the node N10 is pulled high through the coupling effect of the capacitor C10 to turn on the NMOS transistor M3 and turn off the PMOS transistor M2. Accordingly, the output signal SOUT is at the low level of 0V due to the reference voltage GND through the turned-on NMOS transistor M3. In the embodiment, the voltage level of the supply voltage OVDD has a level of, for example, 1.8V between the high level (e.g., 3.3V) of the input signal SIN and the voltage level (e.g., 1V) of the supply voltage VDD, and thus, at this time, the buffer signal S10 is at the level of 1.8V. According to the buffer signal S10 with the level 1.8V, the PMOS transistor M2 is kept turned off, and the NMOS transistor M3 is kept turned on. Thus, the output signal SOUT is kept at the low level of 0V.

When the input signal SIN switches from the high level of 3.3V to the low level of 0V, although the NMOS transistor M1 is turned off, the level of the buffer signal S10 at the node N10 is pulled to a low level through the coupling effect of the capacitor C10 to turn on the PMOS transistor M2 and turn off the NMOS transistor M3. Accordingly, the output signal SOUT is at the high level of 1V due to the supply voltage VDD through the turned-on PMOS transistor M2. Afterwards, the buffer signal S10 is kept at the low level until the input signal SIN switches from the low level of 0V to the high level of 3.3V again. In the embodiment, when the input signal SIN switches from the high level of 3.3V to the low level of 0V, the buffer signal S10 is pulled to a low level of about −0.2V and then kept at the low level of −0.2 until the input signal SIN switches from the low level of 0V to the high level of 3.3V again. The actual voltage level of the low level of the buffer signal S10 may be adjusted by designing the capacitance value of the capacitor C10 and the supply voltage OVDD. The supply voltage OVDD may be designed to be any value between the high level of the input signal SIN and the supply voltage VDD.

According to the above embodiment of FIG. 2, due to the input circuit 10, there is no leakage current path between the supply voltage VDD and the input terminal TIN since the capacitor C10 prevents the direct connection between VDD and TIN, which decreases power consumption.

Moreover, in an embodiment, the transistors M1~M3 may be manufactured by advanced CMOS processes (such as 28 nm processes). When the input signal SIN is at the high level of 3.3V and the buffer signal S10 at the node N10 has the level of, for example, 1.8V, the voltage difference (the gate-drain voltage, Vgd) between the gate and drain of the NMOS transistor M1 is equal to 1.5V (3.3V-1.8V) which is not larger than a predetermined gate oxide breakdown voltage of 1.8V specified by the 28 nm process, such that the NMOS transistor M1 may not be damaged by the input signal SIN with the high level 3.3V. Further, according to the above descriptions, the buffer signal S10 is at the level of 1.8V when the input signal S10 is at the high level of 3.3V. Thus, when the input signal S10 at the high level of 3.3V, the voltage difference (the gate-drain voltage, Vgd) between the gate and drain of the PMOS transistor M2 is equal to 0.8V (1.8V-1V) and the voltage difference (the gate-drain voltage, Vgd) between the gate and drain of the NMOS transistor M3 is equal to 1.8V (1.8V-0V). The gate-drain voltages of both of the transistors M2 and M3 are not larger than the predetermined gate oxide breakdown voltage of 1.8V specified by the 28 nm process, such that the transistors M2 and M3 may not be damaged by the input signal SIN with the high level 3.3V. Accordingly, the input buffer 1 provided by the invention has high voltage tolerance for the input signal SIN.

In summary, an input buffer to prevent leakage current and gate oxide breakdown in advanced processes is disclosed. By avoiding direct current paths between the supply voltage and the input terminal, leakage currents may be eliminated and power consumption may be reduced. In addition, by designing the supply voltages, the voltage differences among the devices may be carefully controlled, and gate oxide breakdown may be prevented.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input buffer for receiving an input signal through an input terminal and outputting an output signal at an output terminal, comprising:
    an input circuit, coupled to the input terminal, receiving the input signal and generating a buffer signal according to the input signal; and
    a level shifting circuit, coupled to the input circuit and the output terminal, receiving a first supply voltage and the buffer signal and generating the output signal at the output terminal according to the buffer signal and the first supply voltage,
    wherein a first high level of the input signal is higher than a voltage level of the first supply voltage, and
    wherein when the input signal is at the first high level, the input circuit generates the buffer signal whose a voltage level is between the first high level of the input signal and the voltage level of the first supply voltage.

2. The input buffer as claimed in claim 1, wherein the input circuit comprises:
    a transistor having a control electrode receiving the input signal, an input electrode receiving a second supply voltage, and an output electrode coupled to the level shifting circuit,
    wherein a voltage level of the second supply voltage is between the first high level of the input signal and the voltage level of the first supply voltage.

3. The input buffer as claimed in claim 2, wherein when the input signal is at the first high level, the input circuit generates the buffer signal whose voltage level is at the voltage level of the second supply voltage.

4. The input buffer as claimed in claim 1, wherein the level shifting circuit comprises:
    an inverter generating the output signal with a second high level when the input signal is at a first low level and generating the output signal with a second low level when the input signal is at the first high level,
    wherein the second high level of the output signal is lower than the first high level of the input signal.

5. The input buffer as claimed in claim 1, wherein the level shifting circuit comprises:
    a first transistor having a control electrode coupled to the input circuit, an input electrode receiving the first supply voltage, and an output electrode coupled to the output terminal;
    a second transistor having a control electrode coupled to the input circuit, an input electrode coupled to the output terminal, and an output electrode coupled to a reference voltage.

6. The input buffer as claimed in claim 1, wherein the input circuit comprises:
    a capacitor, coupled between the input terminal and the level shifting circuit,
    wherein when the input signal switches from the first high level to a first low level, the level of the buffer signal is pulled low through the capacitor.

7. The input buffer as claimed in claim 6, wherein the capacitor is a parasitic capacitor of the input circuit.

8. The output buffer as claimed in claim 6, wherein the capacitor is a physical capacitor element.

9. An input buffer for receiving an input signal through an input terminal and outputting an output signal at an output terminal, comprising:
    a first transistor having a control electrode coupled to the input terminal, an input electrode receiving a first supply voltage, and an output electrode outputting a buffer signal;
    a level shifting circuit, coupled to the output electrode of the first transistor and the output terminal, receiving a second supply voltage and the buffer signal and generating the output signal at the output terminal according to the buffer signal and the second supply voltage,
    wherein a first high level of the input signal is higher than a voltage level of the first supply voltage and a voltage level of the second supply voltage, and the voltage level of the first supply voltage is between the first high level of the input signal and the voltage level of the second supply voltage.

10. The input buffer as claimed in claim 9, wherein the level shifting circuit comprises:
    an inverter generating the output signal with a second high level when the input signal is at a first low level and generating the output signal with a second low level when the input signal is at the first high level,
    wherein the second high level of the output signal is lower than the first high level of the input signal.

11. The input buffer as claimed in claim 9, wherein the level shifting circuit comprises:
    a second transistor having a control electrode coupled to the output electrode of the first transistor, an input electrode receiving the second supply voltage, and an output electrode coupled to the output terminal;
    a third transistor having a control electrode coupled to the output electrode of the first transistor, an input electrode coupled to the output terminal, and an output electrode coupled to a reference voltage.

12. The input buffer as claimed in claim 11, wherein the second transistor is a P-type transistor, and the third transistor is an N-type transistor.

13. The input buffer as claimed in claim 9, further comprising:

a capacitor, coupled between the input terminal and the level shifting circuit, wherein when the input signal switches from the first high level to a first low level, the level of the buffer signal is pulled low through the capacitor.

14. The input buffer as claimed in claim 13, wherein the capacitor is a parasitic capacitor of the first transistor.

15. The input buffer as claimed in claim 13, wherein the capacitor is a physical capacitor element.

16. The input buffer as claimed in claim 9, wherein the first transistor is an N-type transistor.

\* \* \* \* \*